(12) United States Patent
Gogl et al.

(10) Patent No.: US 6,421,271 B1
(45) Date of Patent: Jul. 16, 2002

(54) MRAM CONFIGURATION

(75) Inventors: Dietmar Gogl, Fishkill, NY (US); Till Schlösser, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/935,622

(22) Filed: Aug. 23, 2001

(30) Foreign Application Priority Data

Aug. 23, 2000 (DE) ......................................... 100 41 378

(51) Int. Cl.⁷ ................................................ G11C 11/00
(52) U.S. Cl. ........................................ 365/158; 365/157
(58) Field of Search ................................. 365/158, 157

(56) References Cited

U.S. PATENT DOCUMENTS

| | | | |
|---|---|---|---|
| 5,189,594 A | | 2/1993 | Hoshiba |
| 5,699,293 A | * | 12/1997 | Tehrani et al. ............... 365/131 |
| 5,734,605 A | | 3/1998 | Zhu et al. |
| 5,946,227 A | * | 8/1999 | Naji ............................ 365/158 |

FOREIGN PATENT DOCUMENTS

WO    WO 00/42614    7/2000

OTHER PUBLICATIONS

D.D. Tang et al.: "An IC process compatible Nonvolatile Magnetic RAM", IEDM 95, pp. 997–999.

Hans Boeve et al.: "Technology assessment for the implementation of magnetoresistive elements with semiconductor components in magnetic random access memory (MRAM) architectures", IEEE Transactions on Magnetics, vol. 35, No. 5, pp. 2820–2825, Sep. 1999.

* cited by examiner

Primary Examiner—Huan Hoang
(74) Attorney, Agent, or Firm—Laurence A. Greenberg; Werner H. Stemer; Gregory L. Mayback

(57) ABSTRACT

A magnetoresitive random access memory (MRAM) configuration is described in which one switching transistor is respectively allocated to a plurality of TMR memory cells. In this manner, the space requirement for constructing the MRAM configuration is greatly reduced because the number of switching transistors required is greatly reduced. Therefore, the packing density of the MRAM configuration can be increased.

6 Claims, 2 Drawing Sheets

MRAM CONFIGURATION

BACKGROUND OF THE INVENTION

Field of the Invention

The present invention relates to a magnetoresistive random access memory (MRAM) configuration having a multiplicity of tunnel magneto-resistance (TMR) memory cells that, in a memory cell field, are connected at their one end with bit lines and are connected at their other end to word lines.

As is known, an MRAM configuration is based on ferromagnetic storage with the aid of the TMR effect: between a word line and a bit line that cross one another in perpendicular fashion, there is located a memory cell formed from a layer stack, having a soft magnetic layer, a tunnel resistance layer, and a hard magnetic layer. The direction of magnetization of the hard magnetic layer is predetermined, while the direction of magnetization of the soft magnetic layer can be set by sending corresponding currents in particular directions through the word line and the bit line. In this way, the soft magnetic layer can be magnetized parallel or antiparallel to the hard magnetic layer. In the case of parallel magnetization, the resistance value of the layer stack is lower than in the case of antiparallel magnetization, which can be evaluated an the state "0" or "1," or vice versa.

Up to now, essentially two fundamentally different architectures have been proposed for an MRAM.

In what is known as a cross point construction, the individual TMR memory cells are located directly between printed conductors that cross one another and that form bit lines or word lines. In this construction, no semiconductor elements, in particular transistors, are required for the individual memory cells, so that a plurality of layers of such memory cells can unproblematically be provided in memory cell fields stacked one over the other. In this way, very high integration densities can be achieved for an MRAM, on the order of magnitude of 4 $F^2/n$, where n is the number of the individual layers of memory cell fields stacked one over the other and F signifies the surface of the smallest possible structure of the technology used.

In such a cross point construction, parasitic currents necessarily flow through memory cells that are not selected. For this reason, in large memory cell fields the individual TMR memory cells must be provided with a very high resistance in order to enable the parasitic currents to be kept low. As a result of the high resistance of the individual TMR memory cells, the read process is relatively slow.

In the architecture of the prior art, in which transistor cells are provided, a switching transistor is allocated to each individual TMR element with the above layer stack (on this subject, see the reference by M. Durlam et al., titled "Non-volatile RAM based on Magnetic Tunnel Junction Elements"). In an MRAM having memory cells consisting of such TMR elements with switching transistors, parasitic currents are practically excluded. In this way, the memory cells can be provided with a low resistance of the TMR element, even in large memory cell fields. The read process is also simpler, so that a faster access is possible than is the case given a cross point construction.

However, a disadvantage of Construction with transistor memory cells is the considerably larger dimensions, which run to at least 8 $F^2$ and higher; in addition, no stacking can be carried out because a transistor, and therewith a silicon surface, is required for each memory cell in a memory cell field.

SUMMARY OF THE INVENTION

It is accordingly an object of the invention to provide an MRAM configuration which overcomes the above-mentioned disadvantages of the prior art devices of this general type, in which the advantages of cross point construction are to the greatest possible extent present together with the advantages of transistor memory cells.

With the foregoing and other objects in view there is provided, in accordance with the invention, a magnetoresistive random access memory (MRAM) configuration. The MRAM configuration contains switching transistors with gates, bit lines, word lines, and a memory cell field having a multiplicity of tunnel magneto-resistance (TMR) memory cells each having a first end connected to the bit lines and a second end. The TMR memory cells are divided into groups each containing at least two of the TMR memory cells connected respectively with a same one of the bit lines. The second end of each of the TMR memory cells of each of the groups are connected with one of the switching transistors whose respective gate is connected to a corresponding one of the word lines.

In an MRAM configuration of the type indicated above, the object is inventively achieved in that the other ends of TMR memory cells connected respectively with the same bit line, in groups containing at least two TMR memory cells, are connected with a switching transistor whose gate is connected to the corresponding word line.

Thus, in a complete departure from the previous configuration using transistor memory cells, in the inventive MRAM configuration it is no longer the case that a switching transistor is allocated to each TMR element. Rather, in the inventive MRAM configuration a plurality of TMR memory cells along a bit line are combined to form a group, and a switching transistor is then assigned to the group.

Through the allocation of only one switching transistor to a plurality of TMR memory cells, for example three TMR memory cells, the space required for the transistors can be considerably reduced, so that the architecture used in the inventive MRAM configuration enables a considerable increase of the packing density in the memory cell field.

The inventive MRAM configuration also enables a space-saving layout of the TMR memory cells and of the transistor allocated thereto, by disposing for example one switching transistor under three TMR memory cells.

Of course, however, it is also possible to provide more than three TMR memory cells for one switching transistor. In addition, it is also possible for example to assign only two TMR memory cells to one switching transistor. Finally, such an apportioning of the memory cells of a memory cell field to switching transistors can also be carried out in that, exceptionally, allocations of only one memory cell to a switching transistor can be present. It is therefore essential to the present invention that, in a memory cell field having a multiplicity of memory cells, switching transistors are allocated to the cells in such a way that, for a multiplicity of memory cells of the memory cell field, one switching transistor is respectively assigned to a plurality of memory cells of a respective bit line.

A rapid reading out of the MRAM cells with transistors is then ensured if an absolute difference that is as great as possible is present in the currents obtained during the reading of the two states. That is, the current difference between a parallel state and an antiparallel state of the two magnetic layers should be as great as possible. In order to achieve this, first the resistance of the TMR memory cell, or of the TMR element, should be selected approximately equal to the overall resistance, composed of the switching transistor and the resistance of the lines, that is located in series to this resistance. The smaller the series resistance of the resistance composed of the TMR memory cell and the above overall resistance, the greater becomes the absolute read signal obtained during reading.

As already explained above, in the inventive MRAM configuration, n TMR memory elements are therefore connected in parallel along a bit line, and are connected at its other end with the switching transistor. This has the disadvantage that the signal current flowing through the n TMR memory elements that are located parallel to one another is respectively reduced or "thinned" by this factor n. However, the disadvantage can be at least partially compensated in that there is easily space for a switching transistor under a layout surface for only three TMR memory elements, so that, given an allocation of three TMR memory cells to one switching transistor, a relatively low series resistance can be ensured.

If in this way the three TMR memory cells are connected with one switching transistor, then a group of three memory cells obtained in this way occupies a surface of approximately 15–16 $F^2$, which corresponds to a surface requirement of 5–5.3 $F_2$ for each memory cell. This value is considerably lower than a value of 7–8 $F^2$, which is required given a configuration having memory cells each made up of a TMR element and a transistor. In such a layout, having one switching transistor for three TMR memory cells, in contrast to a configuration with one transistor for each memory cell it is also possible to use a threefold transistor width, so that, given a corresponding getting of the resistances of the TMR elements, the same absolute signal difference between the two states can be achieved.

In accordance with an added feature of the invention, the switching transistors are disposed underneath the TMR memory cells.

In accordance with an additional feature of the invention, two metallization planes are provided and the TMR memory cells are laid between the two metallization planes.

In accordance with a further feature of the invention, the switching transistors each have a ground electrode, and each of two adjacent ones of the switching transistors share a common ground electrode.

Other features which are considered as characteristic for the invention are set forth in the appended claims.

Although the invention is illustrated and described herein as embodied in an MRAM configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
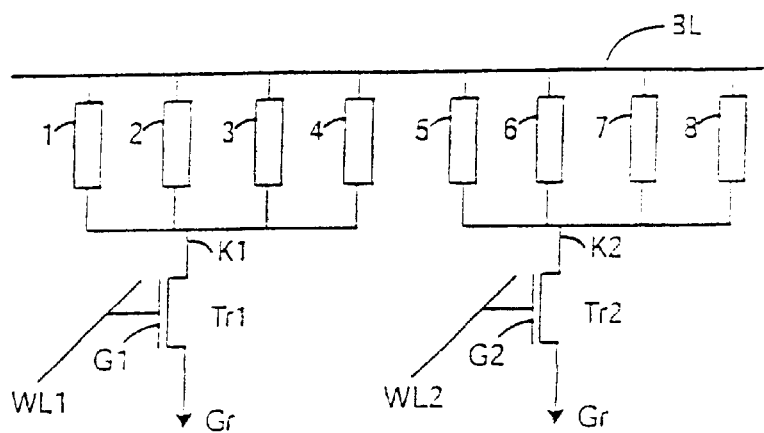
FIG. 1 is a schematic switching diagram for explaining an MRAM configuration according to the invention.

In all the figures of the drawing, sub-features and integral parts that correspond to one another bear the same reference symbol in each case. Referring now to the figures of the drawing in detail and first, particularly, to FIG. 1 thereof, there is shown an MRAM configuration having a bit line BL and word lines WL1 and WL2, which cross the bit line BL essentially perpendicularly, at a distance from one another. Tunnel magneto-resistance (TMR) memory cells 1, 2, 3 and 4 are located between the bit line BL and the word line WL1, and TMR memory cells 5, 6, 7, and 8 are located between the bit line BL and the word line WL2. The memory cells 1–8 are each constructed in the standard manner explained above, from a soft magnetic layer, a tunnel resistance layer, and a hard magnetic layer.

The ends situated opposite the bit line BL of the TMR memory cells 1 to 4 are connected with a drain or source of a switching transistor Tr1, while the ends situated opposite the bit line BL of switching transistors 5 to 8 are connected to a drain or source of a switching transistor Tr2. A gate of switching transistor Tr1 is connected to the word line WL1, and a gate of switching transistor Tr2 is connected to the word line WL2. The source or drain of the switching transistors Tr1 and Tr2 are grounded. In the exemplary embodiment of FIG. 1, the four TMR memory cells 1 to 4 or 5 to 8 are each allocated to one of the switching transistors Tr1 or Tr2. Instead of these four TMR memory cells, two or three memory cells, or more than four memory cells, can also be assigned to one switching transistor.

During a read process, a predetermined voltage of 1 to 2 V is applied to the bit line BL. The transistors of all the word lines, except for the transistors of a particular word line, are thereby blocked. It is here assumed that in the present example the transistors of the word line WL1 conduct, i.e., in the present example the switching transistor Tr1 is supposed to be switched through.

If now, for example, the TMR memory cell 2 is in a low-ohmic state (parallel magnetization of the two magnetic layers), while the remaining TMR memory cells 1, 3 and 4 are in a high-ohmic state (antiparallel magnetization of the magnetic layers), on the word line WL1 a corresponding signal is obtained that differs from the signal that is present on the word line WL1 when all the TMR memory cells 1–4 are in a high-ohmic state.

In order to determine which of the memory cells 1 to 4 is in the low-ohmic state, there takes place similar to the procedure in a DRAM a back-writing of the information into the respective memory cells and a comparison with the previously obtained signal. In this way, it can be determined that the TMR memory cell 2 is in the low-ohmic state, while the memory cells 1, 3 and 4 have a high-ohmic state. In other words, a 1 can for example be allocated to memory cell 2, while memory cells 1, 3 and 4 contain an item of information "0."

FIGS. 2a to 2d indicate the layout for the MRAM configuration of FIG. 1.

Figure 2A:
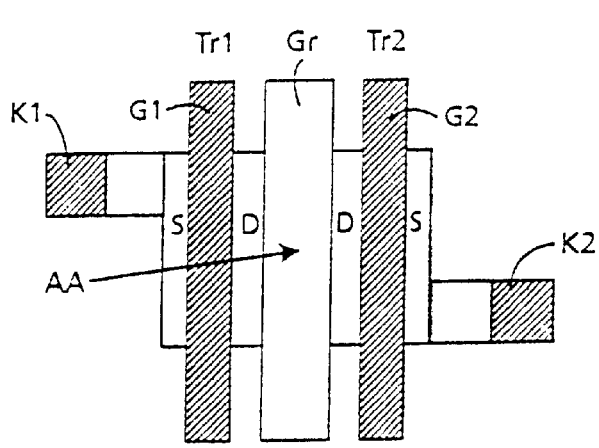
FIGS. 2a to 2d sectional views showing a layout for a group in which three memory cells are each connected with one no switching transistor.

As is indicated in FIG. 2a, in an active region AA of a silicon semiconductor element, a source S and a drain D of each of the two transistors Tr1 and Tr2 are provided and are connected with a contact K1 or K2 through a corresponding diffusion. Transistor Tr1 has a gate electrode G1, and transistor Tr2 has a gate electrode G2. The gate electrode G1 is connected with the word line WL1, while gate electrode G2 is connected to the word line WL2. Moreover, in FIG. 2a another ground electrode Gr of the two transistors Tr1 and Tr2 is shown.

Figure 2C:
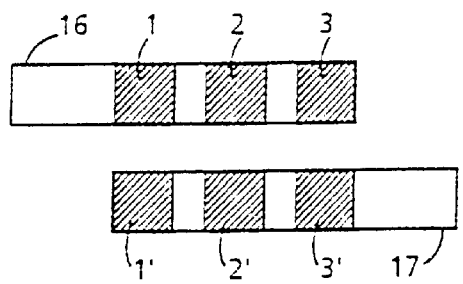
Figure 2B:
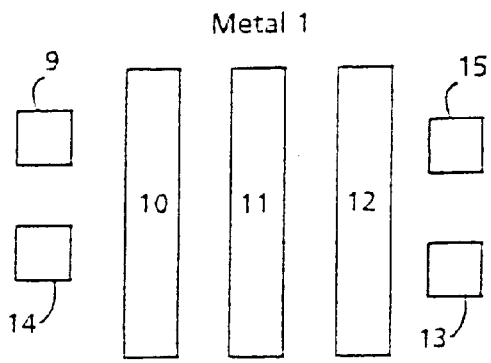

FIG. 2b shows a first metallization plane (Metal 1) for the it configuration of FIG. 2a, with corresponding metallizations 9 (for the contact K1), 10 (for the drain D of the transistor Tr1), 11 (for the ground Gr of the two transistors Tr1 and Tr2), 12 (for the drain of the transistor Tr2), and 13 (for the contact K2 of transistor Tr2). Metallizations 14 and 15 are allocated to adjacent groups of transistors or TMR memory cells.

Figure 2D:
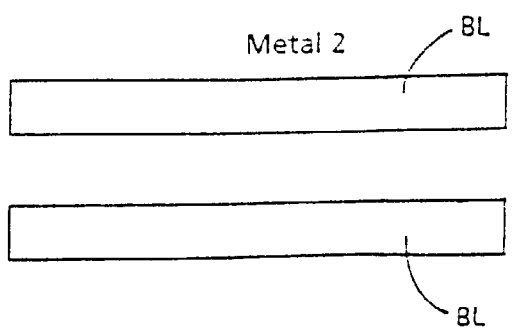

As is shown in FIG. 2c, on the first metallization plane ("Metal 1") of FIG. 2b there are located strip configurations ("Straps") 16, 17, each having TMR memory cells 1, 2 and 3, or 1', 2' and 3'. As is shown in FIG. 2d, the TMR memory cells 1 to 3 or 1' to 3' are allocated to the bit line BL, which runs in a plane above a second metallization plane ("Metal 2"). This is indicated in FIG. 2d in that both strips of the second metallization plane are provided with the reference character It is to be noted that in the exemplary embodiment of FIGS. 2a to 2d, only three of the TMR memory cells are allocated to each transistor Tr1 or Tr2, while in the exemplary embodiment of FIG. 1 each of the transistors Tr1 or Tr2 respectively has four of the TMR memory cells 1 to 4 or 5 to 8.

Figure 3A:
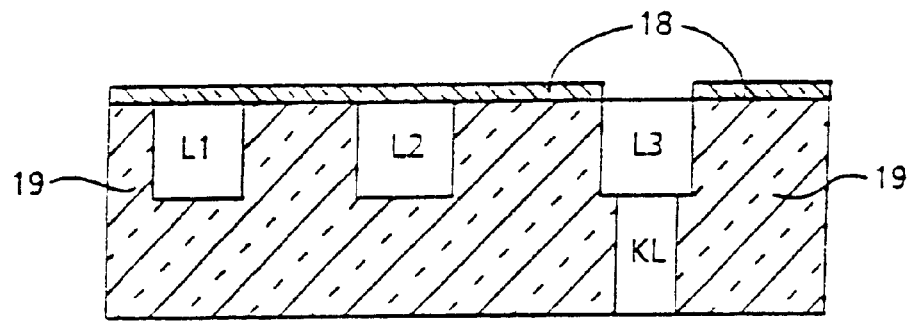
FIGS. 3a to 3c sectional views showing various steps for the explanation of the manufacture of the MRAM configuration.
Figure 3B:
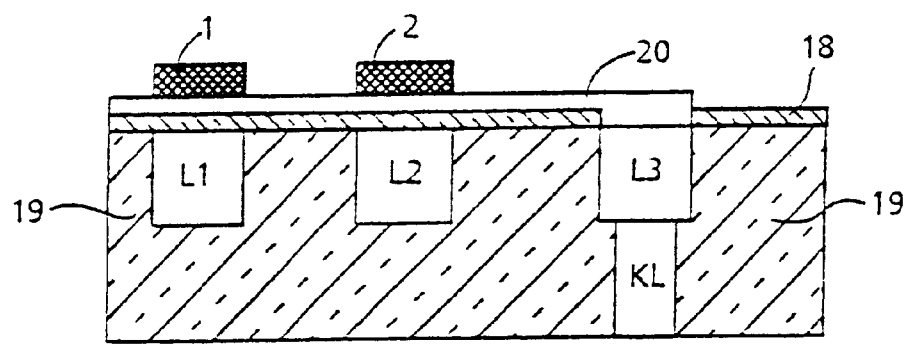
Figure 3C:
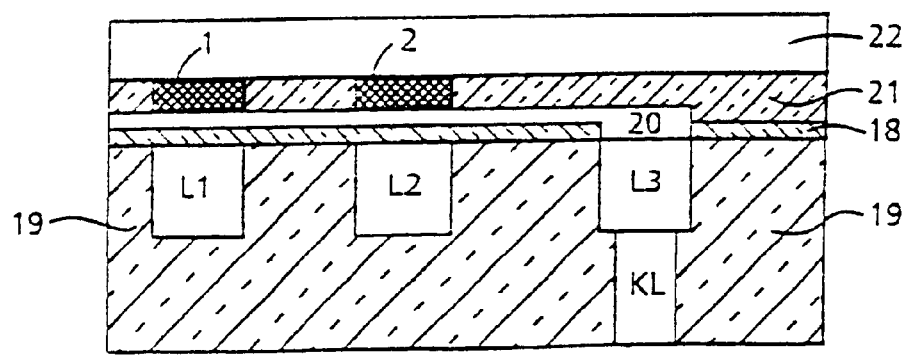

FIGS. 3a to 3c illustrate, in schematic sections, a method for manufacturing the TMR memory cells or elements 1–8.

On a semiconductor element having a CMOS transistor as a switching transistor and a first metallization plane ("Metal 1"; see FIG. 2b), there are located silicon dioxide layers 18, 19 in which printed conductors L1, L2 and L3 are provided. The printed conductors L1 and L2 are used as lines for writing to two of the TMR memory cells, for example memory cells 1 and 2. In a contact hole KL, which is provided with a corresponding metallization, the printed conductor L3 is for example connected with the contact K1 of the transistor Tr1, which is located there under and is embedded in the silicon semiconductor element.

In addition, as shown in FIG. 3b, the printed conductor L3 is connected with the TMR elements 1 and 2 via a metallization 20. The metallization 20 and the TMR elements or memory cells 1 and 2 are manufactured in the standard manner, photolithographically and through etching.

After the deposition of an additional silicon dioxide layer 21 and the second metallization plane through a metallization 22, the configuration shown in FIG. 3c is finally obtained.

Writing to the memory cells 1 and 2 takes place in that corresponding signals are applied to the metallizations L1 or L2 and to the metallization 22, resulting in an antiparallel or parallel magnetization of the two magnetic layers of the memory cells 1 and 2.

We claim:

1. A magneto-resistive random access memory (MRAM) configuration, comprising:

switching transistors with gates;

bit lines;

word lines; and a memory cell field having a multiplicity of tunnel magneto-resistance (TMR) memory cells each having a first end connected to said bit lines and a second end, said TMR memory cells divided into groups each containing at least two of said TMR memory cells connected respectively with a same one of said bit lines, said second end of each of said TMR memory cells of each of said groups connected with one of said switching transistors whose respective gate is connected to a corresponding one of said word lines.

2. The MRAM configuration according to claim 1, wherein each of said TMR memory cells has a resistance corresponding approximately to an overall resistance composed of said one of said switching transistors and allocated line resistances.

3. The MRAM configuration according to claim 1, wherein each of said switching transistors is connected to said second end of three of said TMR memory cells.

4. The MRAM configuration according to claim 1, wherein said switching transistors are disposed underneath said TMR memory cells.

5. The MRAM configuration according to claim 1, including two metallization planes and said TMR memory cells are laid between said two metallization planes.

6. The MRAM configuration according to claim 1, wherein said switching transistors each have a ground electrode, and each of two adjacent ones of said switching transistors share a common ground electrode.

* * * * *

UNITED STATES PATENT AND TRADEMARK OFFICE
CERTIFICATE OF CORRECTION

PATENT NO. : 6,421,271 B1
DATED : July 16, 2002
INVENTOR(S) : Dietmar Gogl et al.

It is certified that error appears in the above-identified patent and that said Letters Patent is hereby corrected as shown below:

<u>Title page,</u>
Item [75], should read as follows:
-- Dietmar Gogl, Essex Junction, VT (US);
  Till Schlösser, Dresden (DE) --

Signed and Sealed this

Twenty-ninth Day of October, 2002

Attest:

Attesting Officer

JAMES E. ROGAN
*Director of the United States Patent and Trademark Office*